(12) United States Patent
Brown et al.

(10) Patent No.: US 11,691,338 B2
(45) Date of Patent: Jul. 4, 2023

(54) ARTICLE CONTAINING CONDUCTIVE FIBERS

(71) Applicant: Hamilton Sundstrand Corporation, Charlotte, NC (US)

(72) Inventors: Ricardo O. Brown, West Hartford, CT (US); Blair A. Smith, South Windsor, CT (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 1098 days.

(21) Appl. No.: 16/401,250

(22) Filed: May 2, 2019

(65) Prior Publication Data

US 2020/0346401 A1 Nov. 5, 2020

(51) Int. Cl.
| | |
|---|---|
| *B29C 64/165* | (2017.01) |
| *B33Y 10/00* | (2015.01) |
| *B33Y 40/00* | (2020.01) |
| *B33Y 70/00* | (2020.01) |
| *B33Y 80/00* | (2015.01) |
| *B29C 64/30* | (2017.01) |
| *B29C 64/118* | (2017.01) |
| *C23C 14/00* | (2006.01) |
| *B29K 71/00* | (2006.01) |
| *B29K 81/00* | (2006.01) |
| *B29K 305/00* | (2006.01) |
| *C23C 18/00* | (2006.01) |
| *C23C 24/00* | (2006.01) |

(52) U.S. Cl.
CPC .......... *B29C 64/165* (2017.08); *B29C 64/118* (2017.08); *B29C 64/30* (2017.08); *B33Y 10/00* (2014.12); *B33Y 40/00* (2014.12); *B33Y 70/00* (2014.12); *B33Y 80/00* (2014.12); *C23C 14/00* (2013.01); *B22F 2303/40* (2013.01); *B29K 2071/00* (2013.01); *B29K 2081/04* (2013.01); *B29K 2305/00* (2013.01); *C23C 18/00* (2013.01); *C23C 24/00* (2013.01)

(58) Field of Classification Search
None
See application file for complete search history.

(56) References Cited

U.S. PATENT DOCUMENTS

| 5,702,584 A | 12/1997 | Goenka et al. |
| 6,899,777 B2 | 5/2005 | Vaidyanathan et al. |
| 10,011,922 B2 | 7/2018 | Graley et al. |

(Continued)

FOREIGN PATENT DOCUMENTS

CN 102409319 A 4/2012

OTHER PUBLICATIONS

Extended European search Report for EP Application No. 19213521.8, dated Jun. 17, 2020, pp. 7.

*Primary Examiner* — Jeffrey D Washville
(74) *Attorney, Agent, or Firm* — Kinney & Lange, P. A.

(57) ABSTRACT

An article includes a body, which includes a thermoplastic or thermoset material and a plurality of metallic fibers distributed throughout the thermoplastic or thermoset material and has a first subset of the plurality of metallic fibers extending onto a first surface of the body. The manufactured article includes a metallic coating metallically bonded to the first subset of the plurality of metallic fibers. The metal fibers extending onto the first surface are configured to bond with the metallic coating.

19 Claims, 2 Drawing Sheets

(56) References Cited

U.S. PATENT DOCUMENTS

2012/0021218 A1* 1/2012 Lee .................. D06M 11/83
 205/159
2016/0368238 A1* 12/2016 Bogue .................. F04D 29/324
2018/0304370 A1 10/2018 Myerberg et al.

* cited by examiner

ARTICLE CONTAINING CONDUCTIVE FIBERS

BACKGROUND

The present disclosure relates generally to additive manufacturing systems for printing three-dimensional (3D) parts. More specifically, the present disclosure relates to additively manufacturing a part and then applying a metal coating on the additively manufactured part.

Traditionally, many aircraft parts have been formed of metal or alloys. On the one hand metal parts are very strong and durable. On the other hand, metal parts are very heavy and require a great deal of fuel to fly. Many traditionally metal parts can be substituted for using composite materials, which are much lighter and require less fuel to fly than aircraft using all metal parts. The aircraft part formed of composite materials can be built, for example, using additive manufacturing techniques.

Additive manufacturing systems are used to build 3D parts from digital representations of the 3D parts (e.g., STL format files) using one or more additive manufacturing techniques. Examples of commercially available additive manufacturing techniques include extrusion-based techniques, ink jetting, selective laser sintering, powder/binder jetting, electron-beam melting, and stereolithographic processes. For each of these techniques, the digital representation of the 3D part is initially sliced into multiple horizontal layers. For each sliced layer, a tool path is then generated, which provides instructions for the particular additive manufacturing system to form the given layer.

For example, in an extrusion-based additive manufacturing system, a 3D part or model may be printed from a digital representation of the 3D part in a layer-by-layer manner by extruding a flowable part material. The part material is extruded through an extrusion tip carried by a print head of the system, and is deposited as a sequence of roads on a substrate in an x-y plane. The extruded part material fuses to previously deposited part material, and solidifies upon a drop in temperature. The position of the print head relative to the substrate is then incremented along a z-axis (perpendicular to the x-y plane), and the process is then repeated to form a 3D part resembling the digital representation.

Some aircraft parts are subjected to high temperatures and pressures during the flight of an aircraft, and a part formed solely from composite materials may not be strong enough or durable enough to withstand the cyclic high temperatures and pressures achieved during flight.

SUMMARY

An article includes a body, which includes a thermoplastic or thermoset material and a plurality of metallic fibers distributed throughout the thermoplastic or thermoset material and has a first subset of the plurality of metallic fibers extending onto a first surface of the body. The manufactured article includes a metallic coating metallically bonded to the first subset of the plurality of metallic fibers. The metal fibers extending onto the first surface are configured to bond with the metallic coating.

A method of manufacturing a coated article includes co-extruding a thermoplastic or thermoset material with a plurality of metallic fibers distributed throughout the thermoplastic or thermoset material. The method includes forming a body from the co-extruded material, which has a first subset of the plurality of metallic fibers extending onto a first surface of the thermoplastic or thermoset material. The metal fibers extending onto the first surface are configured to bond with a metallic coating. The method includes applying a metallic coat to the body, which is metallically bonded to the first subset of the plurality of metallic fibers.

DETAILED DESCRIPTION

Figure 1:
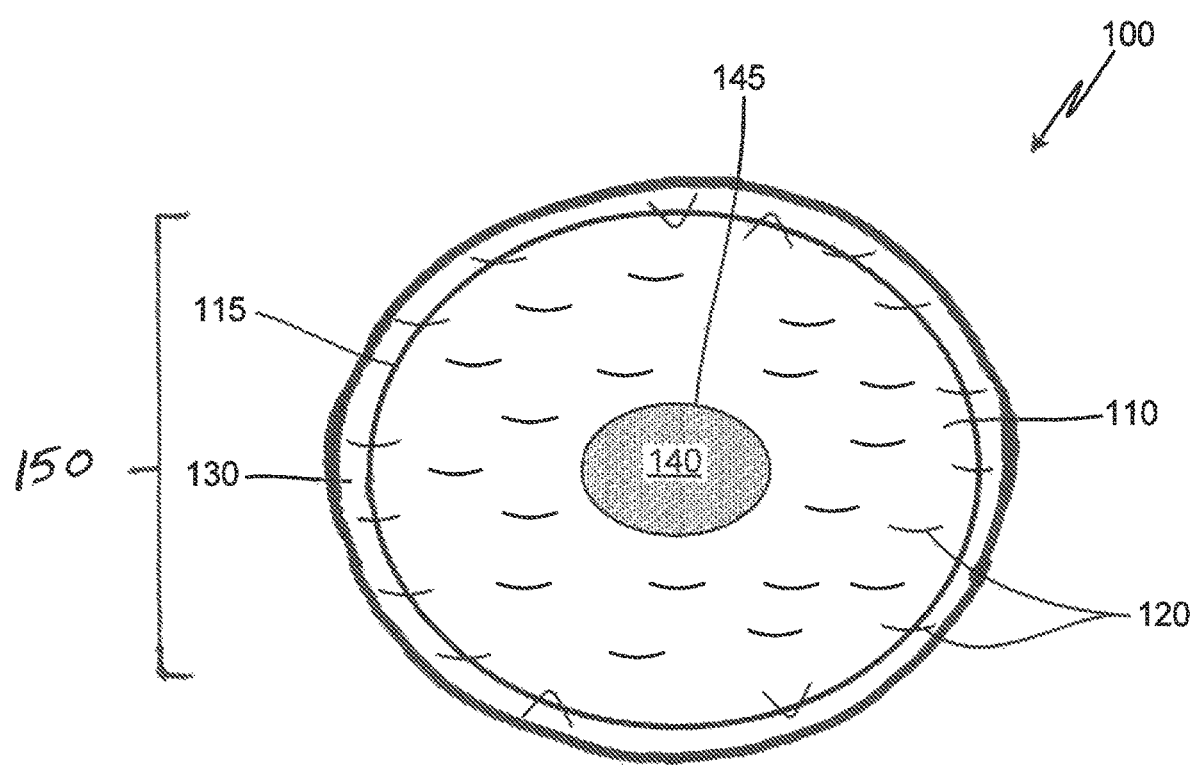
FIG. 1 is a cross-sectional view of an article containing conductive fibers.

While it is desirable to apply a metal coating on a thermoplastic or thermoset material, these materials are non-conductive and are not amenable to electroplating or dynamic cold spray techniques. Although carbon fibers can be added to the thermoplastic resin matrix to increase conductivity, the material is, nonetheless, not conductive enough for direct electroplating. Prior efforts to metallize thermoplastic or thermoset materials have included activating the surface of the thermoplastic material. For example, thermoplastic or thermoset materials may be initially etched in a chromic acid-based solution to enhance its adhesive capabilities. Any excess chromic acid that is produced must then be neutralized. A solution consisting of palladium and tin salts is then applied to the material (salt immersion step). Next, the surface of the material is coated with either nickel or copper from an electroless plating solution. The palladium and tin salt solution serves as a catalyst when combined with nickel or copper. The material is now ready, for electroplating using standard plating technology. However, the bonding strength of the metal coating to the surface of the thermoplastic or thermoset material is low and the metal coating may be easily pried away. The bonding strength of a metal coating using this technique is derived from the total encapsulation of the component. The deposited metals adhere to their adjacent neighbors in the coating, which can create a sealed envelope around the underlying plastic.

Herein, a method is disclosed for applying a metallic coating using electroplating or dynamic cold spray techniques to a thermoplastic or thermoset material. Metal fibers or particles can be co-extruded with a thermoplastic or thermoset for use in fused filament fabrication (FFF) printing processes. The co-extruded material can be used to print components for prototyping or production, which then can be metalized with various coating processes such as, for example, electroplating, ion vapor deposition, and dynamic cold spray. Using this method, the metal coating forms a strong metal-metal bond with partially exposed metallic fibers on the surface that are otherwise mechanically interlocked within the thermoplastic or thermoset material. At least some of the metallic fibers protrude far enough from the surface or are exposed enough on the surface of the thermoplastic or thermoset material to form metal-metal bonds through electroplating, ion vapor deposition, or dynamic cold spray techniques. In other words, the metal fibers create sufficient conductivity on the surface of the thermoplastic or thermoset material to allow a metal coating to be formed on the surface of the thermoplastic or thermoset material using electroplating, ion vapor deposition, or dynamic cold spray techniques. This metal coating may be very difficult to pry away from the thermoplastic or thermoset material compared to a metal coating applied using, for example, an electroless plating, corona discharge, flame treatment, or plasma treatment method.

FIG. 1 is a cross-sectional view of article 100. FIG. 1 shows article 100 including thermoplastic resin 110, first surface 115, metallic fibers 120, metal coating 130, interior feature 140, second surface 145, and body 150.

Thermoplastic resin 110 is formed of any thermoplastic or thermoset material that can be used in an additive manufacturing process such as, for example, polyphenylene sulfide, polyether imide, polyarylether ketones, and combinations thereof. Thermoplastic resin 110 of article 100 is built in a layer-by-layer process using additive manufacturing techniques and has first surface 115.

Metallic fibers 120 are distributed throughout thermoplastic resin 110, which includes first surface 115 of thermoplastic resin 110. In other words, at least some of metallic fibers 120 are not completely embedded internally within thermoplastic resin 110. Of each metallic fiber 120 that is not completely embedded in thermoplastic resin 110, some can have a small portion of metallic fiber 120 exposed on first surface 115 such as one end or other surface of a metallic fiber 120. Other metallic fibers 120 also not completely embedded can have a large portion of metallic fiber 120 exposed on first surface 115 such as a metallic fiber 120 laying in the same plane as first surface 115. Other metallic fibers 120 exposed on first surface 115 can have a range in between a small portion and a large portion exposed on first surface 115. The aggregate surface area of metallic fibers 120 exposed on first surface 115 can, for example, depend on orientation of metallic fibers 120 relative to first surface 115.

Metallic fibers 120 can be formed of any amount of any metal or alloy, which imparts sufficient conductivity to allow a metallic coat to be applied to first surface 115 by electroplating, ion vapor deposition, or dynamic cold spray techniques. Metallic fibers 120 can have a particulate, filament, or fiber structure and be formed entirely from any metal or alloy capable of forming a metal-metal bond with metal coating 130. Alternatively, metallic fibers 120 can be formed of a core material coated with the metal or alloy. Core materials, for example, can be carbon structures such as, for example, graphite, graphene, carbon fibers, carbon nanotubes, and combinations thereof.

Metal coating 130 can be applied directly to first surface 115 by an electroplating technique. Alternatively, metal coating 130 can be applied directly to first surface 115 by an ion vapor deposition technique. Alternatively, metal coating 130 can be applied directly to first surface 115 by a dynamic cold spray technique. Neither electroplating, ion vapor deposition, nor dynamic cold spray requires any surface preparation of first surface 115 prior to deposition of metal coating 130 such as, for example, an electroless plating, corona discharge, flame treatment, or plasma treatment step. Metal coating 130 can be formed of any metal or alloy, which provides conductivity and additional strength or heat resistance to article 100 such as, for example, chromium, nickel, aluminum, titanium, cobalt, iron, copper, gold, silver, stainless steel, Inconel, Waspaloy, Hastelloy, and combinations thereof. Specific metals or alloys can be selected based on the required amount of strength or heat resistance needed. For example, aluminum has good heat resistance below about 425° C., whereas, some chromium and nickel alloys can tolerate heat at temperatures well above 425° C.

Metal coating 130 can be any thickness that imparts strength and heat resistance to article 100 sufficient to survive the stresses within an aircraft under load. For example, article 100 can be placed anywhere in an aircraft such that the stresses experienced by article 100 do not alter the shape of article 100. However, metal coating 130 is not thicker than necessary because additional thickness will unnecessarily add more weight to article 100 without a concomitant gain in strength and/or heat resistance.

Figure 2:
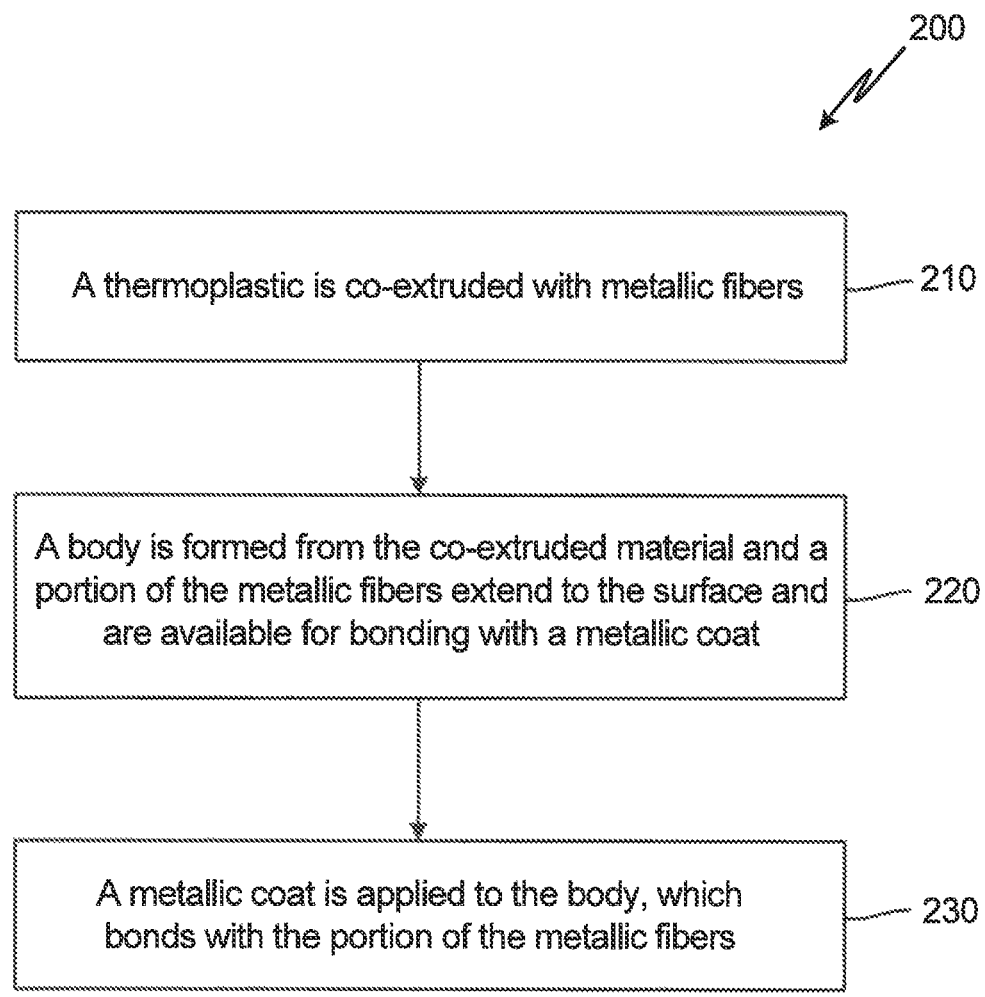
FIG. 2 is a process for manufacturing an article containing conductive fibers.

Article 100 may optionally include interior feature 140. Interior feature 140 can be a hole or void, which could be used, for example, as a cooling hole for cooling article 100. When interior feature 140 is a hole or void, second surface 145 can also have a metal coating applied to the surface of thermoplastic resin 110. Alternatively, interior feature 140 can be a structural feature formed of any material such as a metal or alloy or another thermoplastic resin. When interior feature 140 is optionally included, interior feature 140 together with thermoplastic resin 110 containing metallic fibers 120 form body 150. Alternatively, body 150 can be just formed of thermoplastic resin 110 containing metallic fibers 120. When a structural feature, the material for interior feature 140 can be selected based upon the requirements of the individual part. For example, a metal core may be selected if a part needs to be particularly rigid or strong. The material for interior feature 140 can also be either the same thermoplastic resin selected for thermoplastic resin 110 or be a different thermoplastic or thermoset resin than thermoplastic resin 110. Interior feature 140 formed of a thermoplastic resin may or may not also have metal fibers 120. For example, interior feature 140 can be made of a thermoplastic resin without any metal fibers formed by additive manufacturing. Then as article 100 is built up layer-by-layer, a layer of thermoplastic resin 110 having metal fibers 120 is added on second surface 145 of interior feature 140 forming body 150. The layer of thermoplastic resin 110 is then coated with metal coating 130. FIG. 2 is a process for manufacturing article 100. FIG. 2 shows process 200 including steps 210, 220, and 230.

In step 210, a thermoplastic or thermoset is co-extruded with metallic particles, filaments, or fibers or other material having a metallic coat. At least some of the metallic fibers extend onto the surface of the thermoplastic resin and are available to bond with a metallic coat. Many thermoplastic or thermoset resins are non-conductive. As such, a structure formed from such materials cannot be directly coated with a metallic substrate using electroplating, ion vapor deposition, or dynamic cold spray techniques. In some circumstances, a non-conductive structure can be immersed in a salt bath, which can enable a thin metal layer to be applied to the structure by an electroless plating process. The thin metal layer can then allow additional plating of a metal substrate to the structure using an electroplating technique. Co-extruding metallic fibers with the thermoplastic imparts sufficient conductivity to the surface to allow a metal substrate to be directly bonded to the body, forming a metallic bond between the metallic fibers and the metallic coating, and obviates the need for any additional activation steps such as a salt immersion or electroless plating step prior to using an electroplating, ion vapor deposition, or dynamic cold spray technique.

In step 220, a body is formed from the co-extruded material. The metallic fibers can be evenly distributed throughout the thermoplastic resin. Alternatively, a structure formed of another material such as a metal, alloy, a different thermoplastic resin, or the same thermoplastic resin without the metallic fibers can be formed first (interior feature 140 in FIG. 1) and then a layer of the co-extruded material can be applied on the surface of the formed body. For example, a structure can be formed of a first thermoplastic resin and built up layer-by-layer by an additive manufacturing process. Then, a second thermoplastic resin containing metallic fibers can be added as a layer on top of the first thermoplastic resin using the same additive manufacturing process or a different manufacturing process forming a body. At least some of the metallic fibers at least partially extend onto the surface of the body and are available to bond with a metal substrate. In some embodiments, the second thermoplastic resin can contain metallic fibers with known, non-random distributions of orientations.

In step 230, a metallic coat is applied to the body. The metallic coat bonds with the metallic fibers that at least partially extend onto the surface of the body. The amount of metallic fibers coextruded with the thermoplastic resin is sufficient to allow direct plating of a metal substrate to occur on the surface of the body by an electroplating method without any prior activation steps such as, for example, a salt immersion step or an electroless plating step. Typical metallic coats applied by an electroplating method can be formed of, for example, chromium, nickel, cobalt, copper, gold, or silver. Alternatively, there is enough metallic fibers present on the surface of the thermoplastic resin to allow a metal substrate to adhere to the surface of the body during a dynamic cold spray process. Typical metallic coats applied by a dynamic cold spray method can be formed of, for example, stainless steel, nickel, titanium, aluminum, Inconel, Waspaloy, or Hastelloy. Alternatively, the metallic coat can be applied using ion vapor deposition. A typical metallic coat applied by ion vapor deposition can be formed of aluminum. Any metal or alloy can be used whose vapor temperature does not exceed the temperature of the thermoplastic or thermoset material where it changes shape. The metallic coat can provide, for example, wear resistance or minimize moisture absorption, which can extend the useful life of the part. The metallic coat can also provide, for example, electro-magnetic interference shielding or electrostatic dissipation.

The amount of metallic fibers in the thermoplastic resin may also be adjusted based upon a desired overall strength of the body. For example, a greater amount of metallic fibers can be added to a body which will experience higher pressures and greater stresses under load. The amount of metallic fibers and similarly the thickness of the metal coat can be optimized to result in a part having a desired strength and durability and at the same time weigh as little as possible to maximize fuel usage savings.

The metal coating can also bond more strongly with the metallic fibers in the thermoplastic resin compared to a body which has been immersed in a salt bath. Metal coatings applied to non-conductive materials can result in the metal layer easily being pried off or otherwise being separated from the non-conductive material. A metal coating bonded to a thermoplastic resin with metallic fibers can be more resistant to separation of the metal coating from the thermoplastic resin compared to a thermoplastic resin without metallic fibers.

Discussion of Possible Embodiments

The following are non-exclusive descriptions of possible embodiments of the present invention.

An article includes a body, which includes a thermoplastic or thermoset material and a plurality of metallic fibers distributed throughout the thermoplastic or thermoset material and has a first subset of the plurality of metallic fibers extending onto a first surface of the body. The manufactured article includes a metallic coating metallically bonded to the first subset of the plurality of metallic fibers. The metal fibers extending onto the first surface are configured to bond with the metallic coating.

The article of the preceding paragraph can optionally include, additionally and/or alternatively, any one or more of the following features, configurations and/or additional components:

The first subset of the plurality of metallic fibers is configured to allow the metallic coating to be applied directly on the first surface of the body.

The metallic coating is applied directly on the first surface of the body using an electroplating process, ion vapor deposition, or a dynamic cold spray process.

The thermoplastic or thermoset is selected from the group consisting of polyphenylene sulfide, polyether imide, polyarylether ketones, or combinations thereof.

The metallic coating is formed of a metal or alloy selected from the group consisting of chromium, nickel, aluminum, titanium, cobalt, iron, copper, gold, silver, stainless steel, Inconel, Waspaloy, Hastelloy, or combinations thereof.

The plurality of metallic fibers is formed entirely of a metal or alloy capable of forming a metallic bond with the metallic coating.

The plurality of metallic fibers is metallic coated particles and the particles are selected from the group consisting of graphite, graphene, carbon fibers, carbon nanotubes, or combinations thereof.

The article includes an interior feature formed within the body, which is a cooling void and a second surface, lining the cooling void, which has a second subset of the plurality of metallic fibers extending onto the second surface of the body and is configured to bond with the metallic coating.

The article includes an interior feature formed within the body, which is formed of a different material than the body.

A method of manufacturing a coated article includes co-extruding a thermoplastic or thermoset material with a plurality of metallic fibers distributed throughout the thermoplastic or thermoset material. The method includes forming a body from the co-extruded material, which has a first subset of the plurality of metallic fibers extending onto a first surface of the thermoplastic or thermoset material and is configured to bond with a metallic coating. The method includes applying a metallic coat to the body, which is metallically bonded to the first subset of the plurality of metallic fibers.

The method of the preceding paragraph can optionally include, additionally and/or alternatively, any one or more of the following features, configurations and/or additional components:

The plurality of metallic fibers is configured to allow the metallic coating to be applied directly on the surface of the body.

The metallic coating is applied directly on the first surface of the body using an electroplating process, ion vapor deposition, or a dynamic cold spray process.

The thermoplastic or thermoset is selected from the group consisting of polyphenylene sulfide, polyether imide, polyarylether ketones, or combinations thereof.

The metallic coating is formed of a metal or alloy selected from the group consisting of chromium, nickel, aluminum, titanium, cobalt, iron, copper, gold, silver, stainless steel, Inconel, Waspaloy, Hastelloy, or combinations thereof.

The plurality of metallic fibers is formed entirely of a metal or alloy capable of forming a metallic bond with the metallic coating.

The plurality of metallic fibers is metallic coated particles and the particles are selected from the group consisting of graphite, graphene, carbon fibers, carbon nanotubes, or combinations thereof.

The method includes forming an interior feature within the body, which is a cooling void and forming a second surface, lining the cooling void, which has a second subset of the plurality of metallic fibers extending onto the second surface of the thermoplastic or thermoset material and is configured to metallically bond with the metallic coating.

The method includes forming an interior feature within the body, which is formed of a different material than the body.

Forming the body is carried out using a fused filament fabrication printing process.

An article includes a body formed from a thermoplastic or thermoset material and a plurality of metallic fibers distributed throughout the thermoplastic or thermoset material. The article includes a metallic coating covering the first surface of the body, which is configured to allow the metallic coating to be applied directly on a first surface of the body and which is applied directly on the first surface of the body using an electroplating, ion vapor deposition, or a dynamic cold spray process.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An article comprising:
   a body comprising:
      a thermoplastic or thermoset material; and
      a plurality of metallic fibers distributed throughout the thermoplastic or thermoset material, wherein a first subset of the plurality of metallic fibers extends onto a first surface of the body; and
      an interior feature formed within the body, wherein the interior feature is a cooling void; and
      a second surface, lining the cooling void, wherein a second subset of the plurality of metallic fibers extends onto the second surface of the body and is configured to metallically bond with the metallic coating; and
   a metallic coating metallically bonded to the first subset of the plurality of metallic fibers, wherein the first subset of the plurality of metallic fibers is configured to bond with the metallic coating.

2. The article of claim 1, wherein the first subset of the plurality of metallic fibers is configured to allow the metallic coating to be applied directly on the first surface of the body.

3. The article of claim 2, wherein the metallic coating is applied directly on the first surface of the body using an electroplating, ion vapor deposition, or a dynamic cold spray process.

4. The article of claim 1, wherein the thermoplastic or thermoset is selected from the group consisting of polyphenylene sulfide, polyether imide, polyarylether ketones, or combinations thereof.

5. The article of claim 1, wherein the metallic coating is formed of a metal or alloy selected from the group consisting of chromium, nickel, aluminum, titanium, cobalt, iron, copper, gold, silver, stainless steel, Inconel, Waspaloy, Hastelloy, or combinations thereof.

6. The article of claim 1, wherein the plurality of metallic fibers is formed entirely of a metal or alloy capable of forming a metallic bond with the metallic coating.

7. The article of claim 1, wherein the plurality of metallic fibers is metallic coated particles and the metallic coated particles are selected from the group consisting of graphite, graphene, carbon fibers, carbon nanotubes, or combinations thereof.

8. The body of claim 1 and further comprising:
   an interior feature formed within the body, wherein the interior feature is formed of a different material than the body.

9. A method of manufacturing a coated article, the method comprising:
   co-extruding a thermoplastic or thermoset material with a plurality of metallic fibers distributed throughout the thermoplastic or thermoset material;
   forming a body from the co-extruded material, wherein a first subset of the plurality of metallic fibers extends onto a first surface of the body and is configured to bond with a metallic coating; and
   an interior feature formed within the body, wherein the interior feature is a cooling void; and
   a second surface, lining the cooling void, wherein a second subset of the plurality of metallic fibers extends onto the second surface of the body and is configured to metallically bond with the metallic coating; and
   applying the metallic coating to the body, wherein the metallic coating is metallically bonded to the first subset of the plurality of metallic fibers.

10. The method of claim 9, wherein the plurality of metallic fibers is configured to allow the metallic coating to be applied directly on the first surface of the body.

11. The method of claim 10, wherein the metallic coating is applied directly on the first surface of the body using an electroplating, ion vapor deposition, or a dynamic cold spray process.

12. The method of claim 9, wherein the thermoplastic or thermoset is selected from the group consisting of polyphenylene sulfide, polyether imide, polyarylether ketones, or combinations thereof.

13. The method of claim 9, wherein the metallic coating is formed of a metal or alloy selected from the group consisting of chromium, nickel, aluminum, titanium, cobalt, iron, copper, gold, silver, stainless steel, Inconel, Waspaloy, Hastelloy, or combinations thereof.

14. The method of claim 9, wherein the plurality of metallic fibers is formed entirely of a metal or alloy capable of forming a metallic bond with the metallic coating.

15. The method of claim 9, wherein the plurality of metallic fibers is metallic coated particles and the metallic coated particles are selected from the group consisting of graphite, graphene, carbon fibers, carbon nanotubes, or combinations thereof.

16. The method of claim 9 and further comprising:
   forming an interior feature within the body, wherein the interior feature is a cooling void; and
   forming a second surface of the body, lining the cooling void, wherein a second subset of the plurality of metallic fibers extends onto the second surface of the thermoplastic or thermoset material and is configured to metallically bond with the metallic coating.

17. The method of claim 9 and further comprising:
   forming an interior feature within the body, wherein the interior feature is formed of a different material than the body.

18. The method of claim 9, wherein forming the body is carried out using a fused filament fabrication printing process.

19. An article comprising:
- a body comprising:
  - a thermoplastic or thermoset material; and
  - a plurality of metallic fibers distributed throughout the thermoplastic or thermoset material, wherein a first subset of the plurality of metallic fibers extends onto a first surface of the body; and
  - an interior feature formed within the body, wherein the interior feature is formed of a different material than the body; and
- a metallic coating metallically bonded to the first subset of the plurality of metallic fibers, wherein the first subset of the plurality of metallic fibers is configured to bond with the metallic coating.

* * * * *